(12) United States Patent
Kokubu

(10) Patent No.: US 6,200,858 B1
(45) Date of Patent: Mar. 13, 2001

(54) FLOATING GATE SIDEWALL STRUCTURE FOR THE SUPPRESSION OF BIRD'S BEAK

(75) Inventor: Kunio Kokubu, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/365,770

(22) Filed: Aug. 3, 1999

(30) Foreign Application Priority Data

Aug. 4, 1998 (JP) .................................... 10-220241

(51) Int. Cl.$^7$ ............................................. H01L 21/8247
(52) U.S. Cl. ...................... 438/261; 438/257; 438/761; 438/265; 438/595
(58) Field of Search ................... 438/261, 52, 63, 438/43, 56, 61, 257, 199

(56) References Cited

U.S. PATENT DOCUMENTS

| 5,729,035 | * | 3/1998 | Anma ................................... 257/324 |
| 5,830,794 | * | 11/1998 | Kusunoki et al. .................... 438/266 |
| 5,879,992 | * | 3/1999 | Hsich et al. .......................... 438/264 |
| 5,879,993 | * | 3/1999 | Chien et al. ......................... 438/266 |
| 5,960,285 | * | 9/1999 | Hong ................................... 438/264 |
| 5,962,891 | * | 10/1999 | Arai ..................................... 257/324 |

* cited by examiner

Primary Examiner—Mary Wilczewski
Assistant Examiner—David Goodwin
(74) Attorney, Agent, or Firm—Young & Thompson

(57) ABSTRACT

A semiconductor storage device in which a gate bird's beak occurring under a floating gate is suppressed includes a side wall formed on the side face of a floating gate constructed by an HTO film, a nitride film, and an HTO film.

7 Claims, 8 Drawing Sheets

|  | PRESENT INVENTION | CONVENTIONAL ART 1 | CONVENTIONAL ART 2 |
|---|---|---|---|
| Vcg/Vd | -7.8/4.8 | -7.8/4.8 | -8.5/5.6 |
| WRITING TIME | 600μs | 9.7ms | 600μs |
| INITIAL WRITING CURRENT | 90nA | 40nA | 150nA |
| MAXIMUM PASSING CHARGE DENSITY / 100,000 TIMES | 8.4C/cm2 | 13.0C/cm2 | 12.6C/cm2 |

Fig.6

PLAN VIEW

AA'/CROSS SECTION

BB'/CROSS SECTION

GATE BIRD'S BEAK

ENLARGED VIEW

FLOATING GATE SIDEWALL STRUCTURE FOR THE SUPPRESSION OF BIRD'S BEAK

BACKGROUND OF THE INVENTION

1. Field of the Invention

The present invention relates to a semiconductor storage device and, more particularly, to a semiconductor storage device provided with a non-volatile memory having a floating gate.

2. Description of the Related Art

In recent years, demand for a non-volatile memory in which stored data is held even after the power is turned off is increasing. Especially, demand on an EEPROM (Electrically Erasable Read-Only Memory) is increasing. A cell structure of a conventional EEPROM will be described with reference to FIGS. 7(a) to 7(c) and FIG. 8. The EEPROM comprises a source 12, a drain 11, a floating gate 3 for accumulating charges, a gate insulating film (tunnel oxide film) 5 formed between the floating gate and a well, an ONO film (insulating film) 4 which is a stacked layer of an oxide film—a nitride film—an oxide film formed between a control gate and the floating gate, and a side wall 13 covering the side faces of the floating gate and the control gate. As shown in a cross section of FIG. 8 taken along the line A–A', the side faces of the floating gate 3 and the control gate 5 are covered with a thermal oxide film 13-1 having a thickness of 100 angstroms or larger, the thermal oxide film 13-1 is covered with a hot thermal oxide (HTO) film 13-2, and the HTO film 13-2 is covered with a CVD oxide film 13-3 deposited by chemical vapor deposition (CVD). Since electrons in the floating gate 3 are leaked and the data holding characteristics deteriorate when only the HTO film 13-2 and the CVD oxide film 13-3 are used, the thermal oxide film is formed during heat treatment to improve the film quality of the HTO film 13-2 and to improve the data holding characteristics. The thermal oxide film is formed by diffusing oxygen into the floating and control gates via the HTO film 13-2.

The problems of the conventional EEPROM are as follows. A gate insulating film 2 under the floating gate 3 is also subjected to oxidization similarly due to the heat of thermal oxidation used to form the side wall 13. As a result, what is called a gate bird's beak such that a tunnel film as the gate oxide film 2 near the edge of the floating gate 3 becomes thick occurs. A Fowler-Nordhein current which becomes larger as the drain impurity concentration becomes higher and whose current density becomes higher as the tunnel film becomes thinner is not passed near the edge of the floating gate where the drain impurity concentration is high and the tunnel film is thin. The Fowler-Nordhein tunneling phenomenon (FN tunneling phenomenon) does not therefore contribute to writing. Consequently, a first problem such that the speed of electrons moving from the floating gate to the drain decreases occurs. A second problem is as follows. The FN tunneling current is not passed around the edge of the floating gate 3, the electrons are moved only from a part of the tunnel film, and the amount of electrons passing the tunnel film per unit area increases, so that tolerance to the number of rewriting times deteriorates. As a third problem, since the tunnel film near the edge at which the FN phenomenon that the electrons can be moved with a small amount of the writing current occurs becomes thicker, the interband tunneling current becomes dominant and the writing efficiency (FN current/current consumed at the occasion of writing) deteriorates.

SUMMARY OF THE INVENTION

It is therefore an object of the invention to provide an EEPROM to which data can be written faster, whose tolerance to rewriting is improved, and further, which reduces a current consumed by writing.

According to the invention, there is provided a semiconductor storage device for holding data on the basis of carriers held in a floating gate, comprising: a first oxide film formed on a side face of the floating gate; a nitride film formed on a side face of the oxide film; and a second oxide film formed on a side face of the nitride film, wherein the first oxide film, the nitride film, and the second oxide film form a side wall of the floating gate.

With such a structure, the time of the thermal oxidation conventionally performed to improve the film quality of the HTO film can be shortened and a gate bird s beak occurring at the edge portion of the gate oxide film can be reduced.

According to the invention, there is also provided a semiconductor storage device for holding data on the basis of carriers held in a floating gate, comprising: a first nitride film formed on a side face of the floating gate; a first oxide film formed on a side face of the nitride film; a second nitride film formed on a side face of the first oxide film; and a second oxide film formed on a side face of the second nitride film, wherein the first nitride film, the first oxide film, the second nitride film, and the second oxide film form a side wall of the floating gate.

With such a structure, the first nitride film works as a barrier layer at the occasion of thermal oxidation and occurrence of a gate bird's beak can be prevented.

BRIEF DESCRIPTION OF THE DRAWINGS

FIG. 6 is a characteristics diagram in which characteristics of the first embodiment of the invention are compared with those of conventional arts.

DETAILED DESCRIPTION OF THE PREFERRED EMBODIMENTS

Embodiments of the invention will be described in detail hereinbelow with reference to the drawings.

Figure 1:
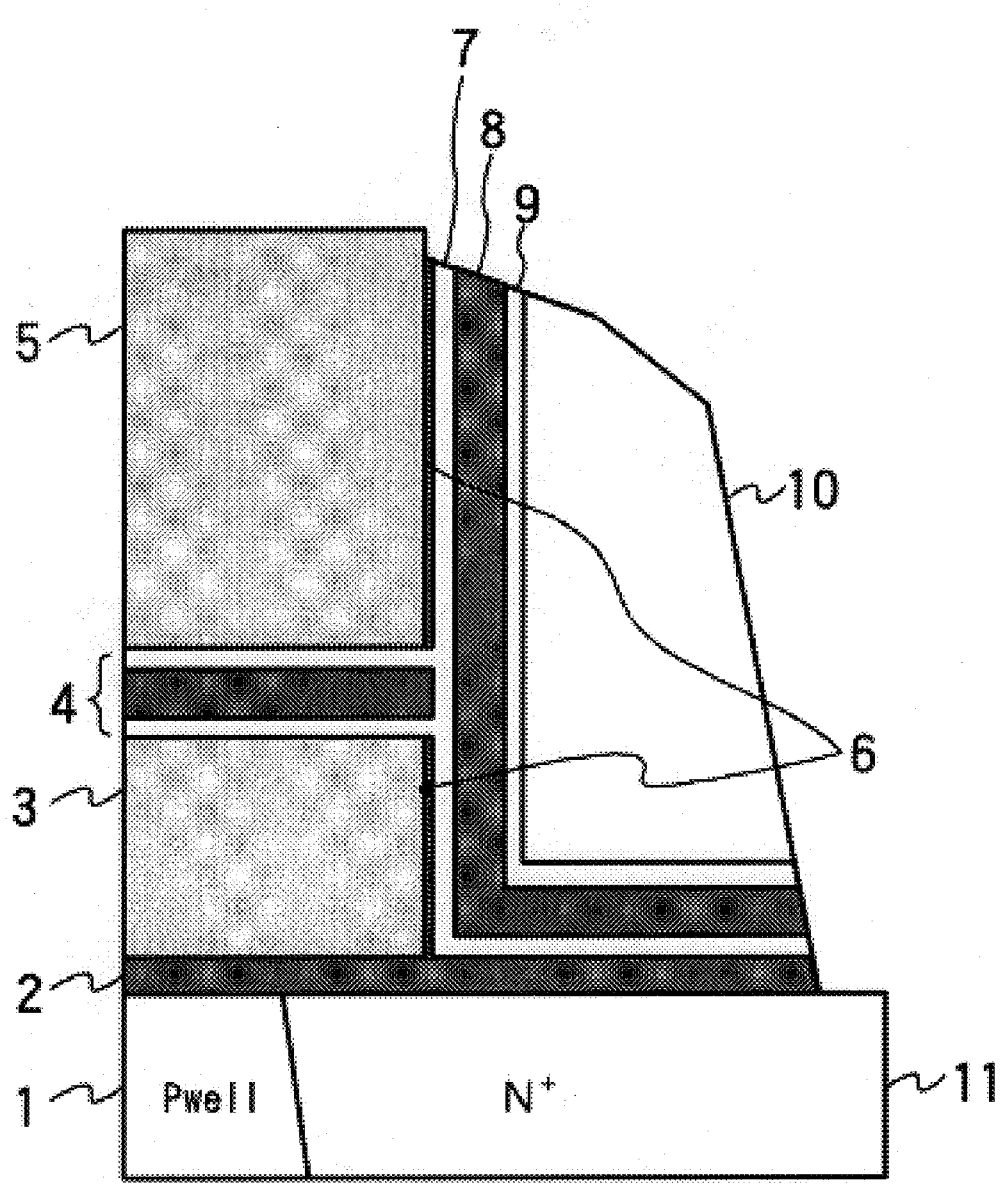
FIG. 1 is a cross section showing the structure of an EEPROM according to a first embodiment of the invention.
Figure 2A:
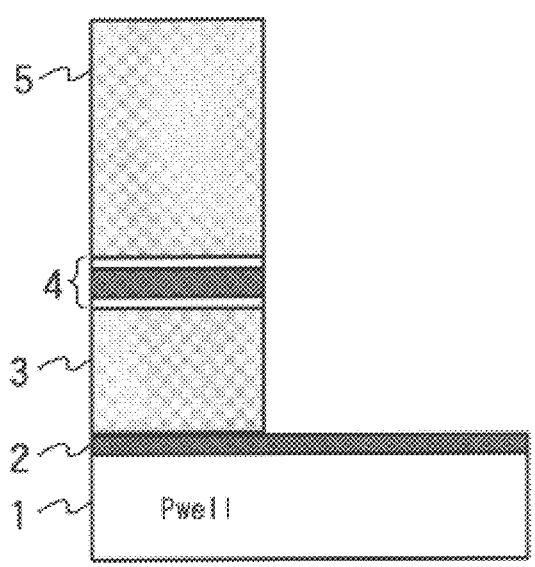
FIGS. 2(a) to 2(c) are cross sections each showing a fabricating process of the EEPROM according to the first embodiment of the invention.
Figure 2B:
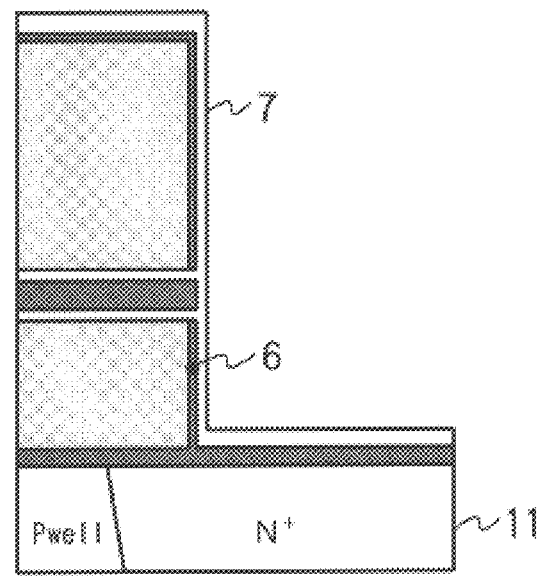
Figure 2C:
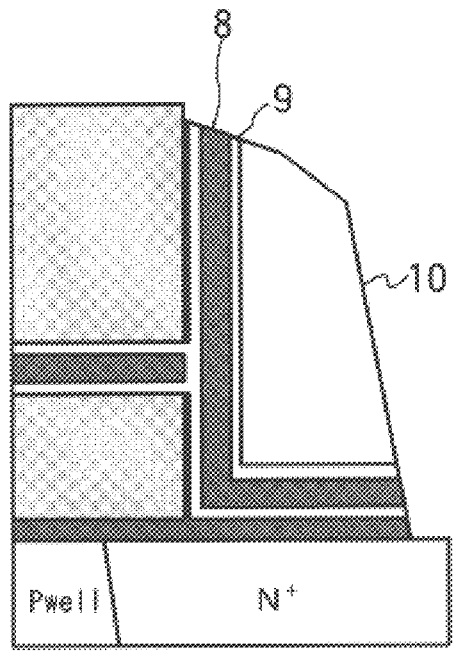

An EEPROM according to the first embodiment is illustrated in FIGS. 1 and 2.

A P-well 1 is formed in a semiconductor substrate, an $SiO_2$ film (oxide film) 2 of 80 angstroms is formed by thermal oxidizing the substrate, and a polysilicon film 3 of 1500 angstroms into which phosphorus of an intermediate concentration is doped, an ONO film 4 consisting of a hot thermal oxide (HTO) film having a thickness of 40 angstroms formed at the temperature of 800° C. or higher, an $Si_3N_4$ (nitride) film having a thickness of 80 angstroms, and an HTO film having a thickness of 40 angstroms, and a WSi (tungsten polycide) film 5 having a thickness of 3000 angstroms are sequentially deposited and selectively etched by photolithography. FIG. 2(a) shows a state after the etching is finished. The ONO film 4 has to be formed with a sufficient leak characteristic so that a leakage does not occur between the control gate 5 and the floating gate 3. Since it is necessary to hold a large capacity between the gates, the nitride film having a high capacity ratio is formed thickly. As compared with the case where the oxide film having a capacity ratio lower than that of the nitride film is formed so as to be thick, the ONO film 4 can be formed thinner and the larger capacity between the gates can be held.

After that, ions are implanted by using the selectively left gate electrode as a mask and arsenic of a high concentration is doped, thereby forming a diffusion layer (corresponding to a drain 11 in the diagram). Subsequently, an HTO film 7 is formed and thermal oxidation is performed in an oxygen atmosphere under the conditions of 900° C. and five to six minutes in order to improve the film quality of the HTO film 7. At this time, in a manner similar to the conventional art, a thermal oxide film 6 of about 30 angstroms is formed on the side of the floating gate and the oxidation develops from the outside toward the inside also around the edge of the floating gate. Since the HTO film 7 is thin, it does not take much time for the thermal oxidation, the thickness of the thermal oxide film 6 can be suppressed to be as thin as 30 angstroms. Consequently, the gate bird's beak can be suppressed to 100 angstroms or smaller and the tunnel film near the edge becomes about 90 angstroms thick. By the heat treatment of the thermal oxidation, the impurities implanted into the drain 11 are activated and the concentration of the impurities becomes $1.5 \times 10^{20}/cm^3$. The activated impurities are diffused from the edge of the floating gate to the portion under the floating gate by an amount of 0.07 μm. Within the narrow range of 0.07 μm to the drain junction, the impurity concentration changes from $10^{20}$ order/$cm^3$ to $10^{17}$ order/$cm^3$.

On the HTO film 7, an $Si_3N_4$ film (nitride film) 8 of 80 angstroms, an HTO film 9 of 40 angstroms, and further, a CVD-$SiO_2$ film (CVD oxide film) 10 of 1100 angstroms deposited by CVD are sequentially formed. The CVD oxide film 10, HTO film 9, nitride film 8, HTO film 7, and thermal oxide film 6 are anisotropically etched to thereby form side walls. By using the three-layer structure of the HTO film 7—nitride film 8—HTO film 9, leakage of carriers (electrons in this case) from the side wall can be suppressed. By the side wall of the CVD oxide film 10 which is rather thick, it can be prevented that the etching to form the side wall and plasma charging in a process after that exert an influence on the insulating film on the side face of the floating gate.

Figure 3:
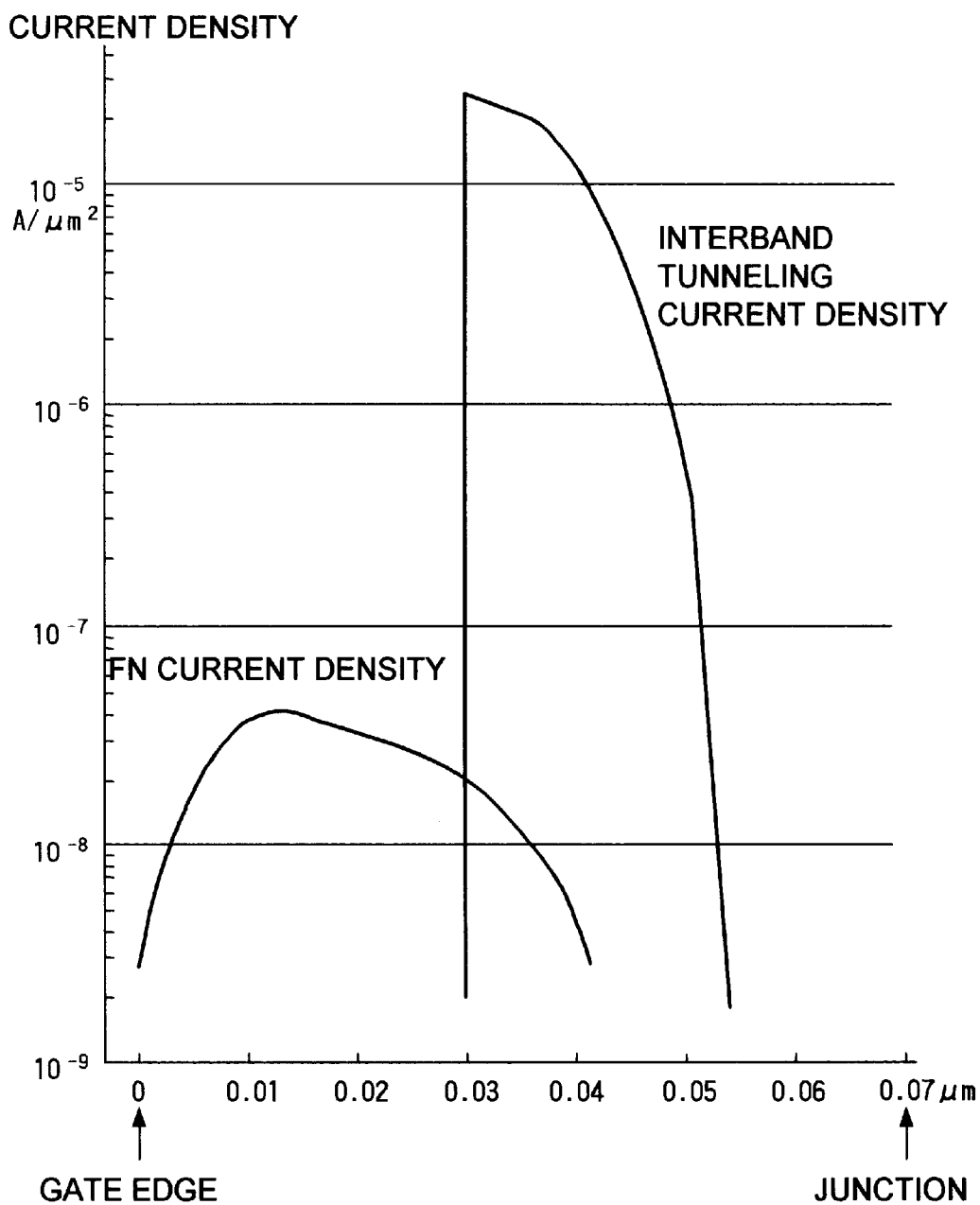
FIG. 3 is a characteristics diagram showing an FN current density in the initial period of movement of electrons, interband tunneling current density, and distance between the gate edge and the junction.

According to the first embodiment of the invention, occurrence of the gate bird's beak in the edge part of the tunnel oxide film 2 can be suppressed. FIG. 3 shows the relation between the distance from the gate edge of the tunnel oxide film to the junction and the density of a current passing through the tunnel oxide film when the gate bird's beak is suppressed. At the occasion of writing data onto the EEPROM, −7.8V is applied to the control gate 5, 4.8V is applied to the drain 11, 0V is applied to the P-well 1, and the source is opened. By a capacity ratio of 0.68 between the floating gate 3 and the control gate 5 when electrons existing in the floating gate 3 and the entire capacity applied to the floating gate 3 is set to 1, the potential of the floating gate 3 becomes −7.0V. Since the impurity concentration changes by three digits within the range of 0.07 μm of the laterally spread drain under the floating gate, a voltage shared by a depletion layer on the surface of the drain 11 is proportional to the lateral axis of FIG. 3. The electric field in the tunnel film is accordingly proportional to the lateral axis. As a result, the FN tunneling current density and the interband tunneling current density are similarly proportional to the lateral axis. The reason why the FN current density decreases around the gate edge is because the tunnel film in this part is 90 angstroms thick and slightly thick due to the gate bird's beak of about 100 angstroms.

Since the gate bird's beak is very large in the conventional art, the FN current density on the left side from 0.02 μm (near to the gate edge) is as low as almost zero. In the embodiment, the FN current density on the left side from 0.02 μm contributes to the writing, so that the writing speed increases and the writing efficiency (FN current/interband tunneling current) is improved. In the embodiment, the interband tunneling current of each memory cell is 90 nA in the beginning of the writing process. As the electrons are moved by the writing operation, the potential of the floating gate 3 rises and the electric field in the tunnel film becomes smaller. The FN current and the interband tunneling current consequently decrease in association with the decrease in the electric field. The time required by the writing is 600 μs and the density of passing charges in a part where the FN current density is highest is 8.4 $C/cm^2$ per 100,000 times of rewriting operations.

FIG. 6 shows a control gate voltage Vcg, a drain voltage Vd, writing time, an initial writing current, and the maximum passing charge density of the EEPROM of each of the first embodiment and conventional EEPROMs. Conventional arts 1 and 2 have different control voltages Vcg and drain voltages Vd but has the same EEPROM structure.

When the EEPROM of the embodiment is compared with that of the conventional art 1 to which the same voltage is applied, the writing time of the embodiment is 600 μm which is faster than 9.7 ms of the conventional art 1 by more than one digit. Although the initial writing current of the conventional art 1 is smaller than that of the embodiment, the maximum passing charge density of the embodiment is 8.4 $C/cm^2$ which is lower than 13.0 $C/cm^2$ of the conventional art 1. When an EEPROM is fabricated according to a design in which the maximum passing charge density of the tunnel oxide film of the EEPROM is 15.0 $C/cm^2$, while the number of rewriting times in the construction of the conventional art 1 is about 115,000, the number of rewriting times of about 178,000 is realized in the first embodiment. It is therefore understood that the first embodiment realizes the reliability higher than that of the conventional art 1.

The first embodiment will now be compared with the conventional art 2 on the condition that voltages are different but the writing time is the same. The initial writing current of the first embodiment is 90 nA which is smaller than 150 nA of the conventional art 2. In a manner similar to the conventional art 1, the maximum passing charge density of the embodiment is 8.4 $C/cm^2$ which is smaller than 12.6 $C/cm^2$ of the conventional art 2. When the maximum passing charge density of the tunnel oxide film of the EEPROM is designed at 15.0 $C/cm^2$, therefore, the number of rewriting times of the conventional art 2 is about 119,000, while the first embodiment realizes the number of rewriting times of about 178,000. It will be therefore understood that the first embodiment realizes the reliability higher than the conventional art 2.

Figure 4:
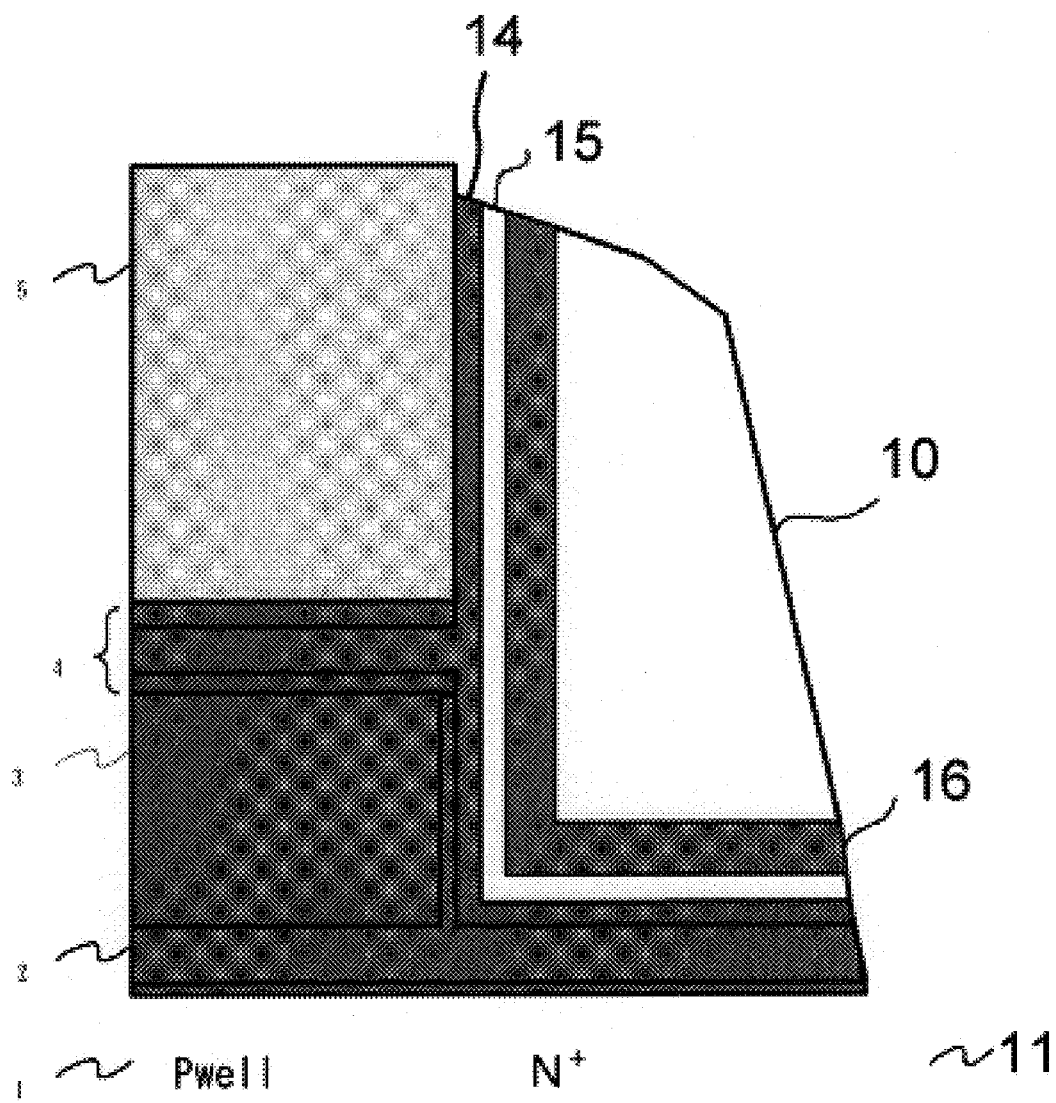
FIG. 4 is a cross section showing the structure of an EEPROM according to a second embodiment of the invention.

FIG. 4 shows an EEPROM according to a second embodiment of the invention.

Since processes of selectively forming the gate electrode and selectively doping the impurities are substantially the same as those shown in FIG. 2(*a*) of the first embodiment, their description is omitted here.

A nitride film 14, an HTO film 15 of 40 angstroms, a nitride film 16 of 80 angstroms, and a CVD oxide film 10 of 1100 angstroms are sequentially deposited on the whole surface. The CVD oxide film 10, nitride film 16, HTO film 15, and nitride film 14 are anisotropically etched to thereby form a side wall. As a result, the construction as shown in FIG. 4 is obtained.

Since the nitride film 14 is formed on the side face of the tunnel oxide film, the nitride film 14 serves as a barrier layer so that oxygen can be prevented from being diffused into the tunnel oxide film. Even if heat treatment such as thermal oxidation or impurity activation is performed after formation of the nitride film 14 on the side faces of the floating gate 3 and the control gate 5, oxygen is not diffused into the tunnel oxide film, so that the gate bird's beak does not occur. Since the ONO structure of the HTO film 15—nitride film 16—CVD oxide film 10 is formed on the side wall via the nitride film, a leak current from the side wall can be also suppressed.

Deterioration in the characteristics due to the gate bird's beak can be -therefore eliminated. As compared with the first embodiment, the writing speed is further increased, the rewriting tolerance is further improved, and the current consumed by the writing operation can be further reduced.

Figure 5:
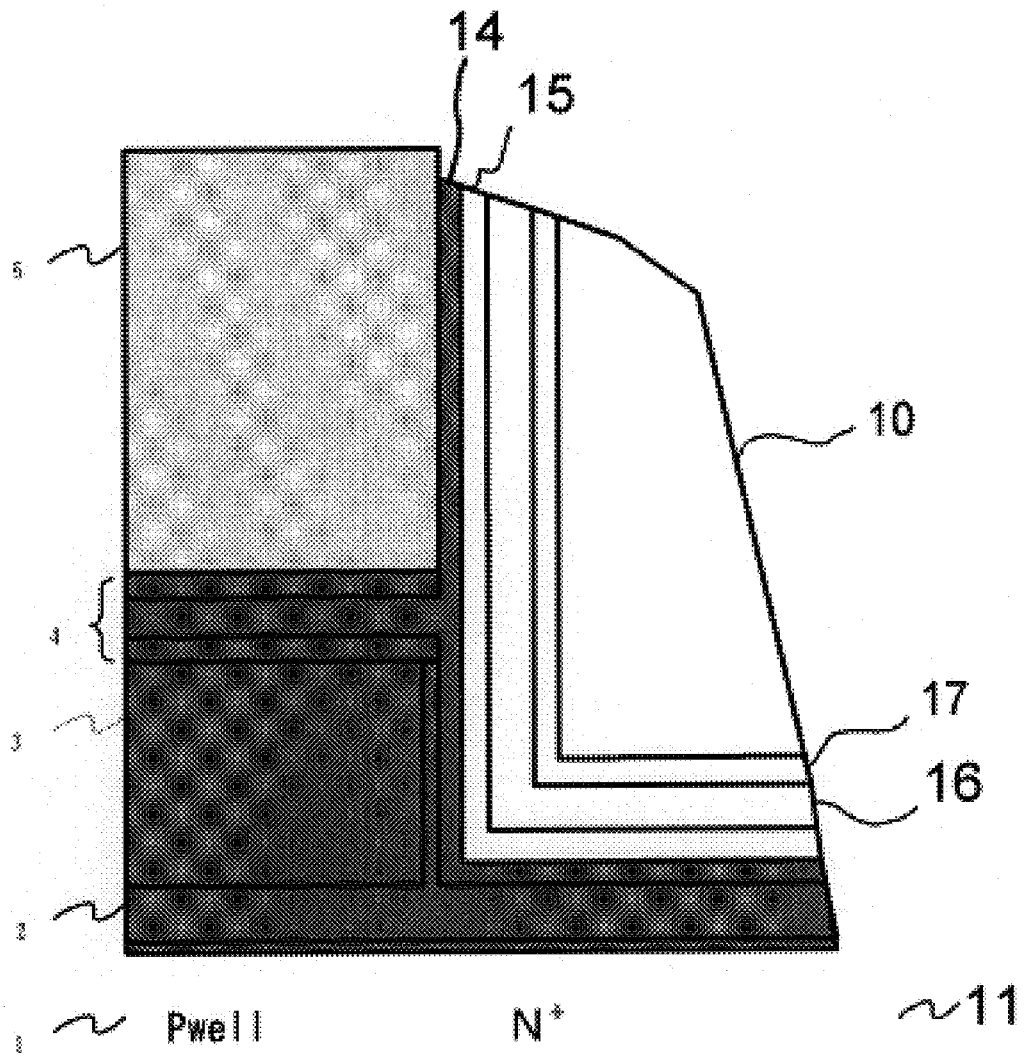
FIG. 5 is a cross section showing the structure of an EEPROM according to a third embodiment of the invention.
Figure 7A:
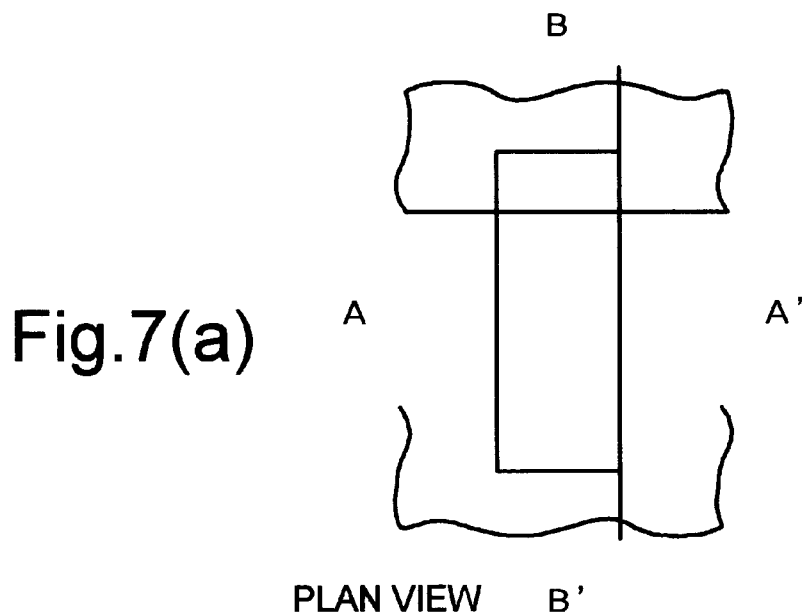
FIG. 7(a) is a top view of a conventional EEPROM.
Figure 7B:
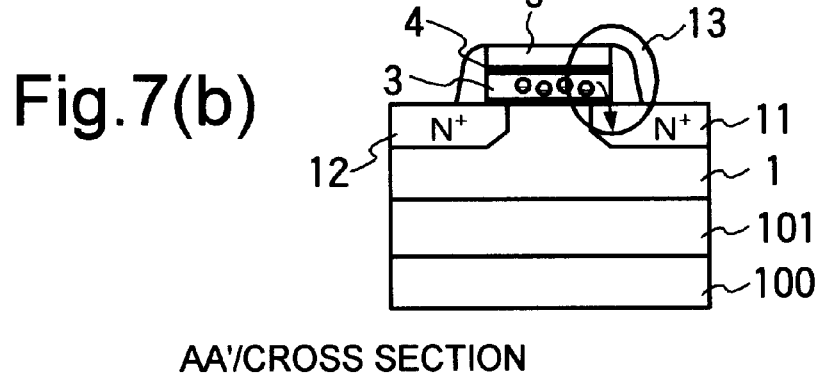
FIG. 7(b) is a cross section taken along the line A–A' of the conventional EEPROM.
Figure 7C:
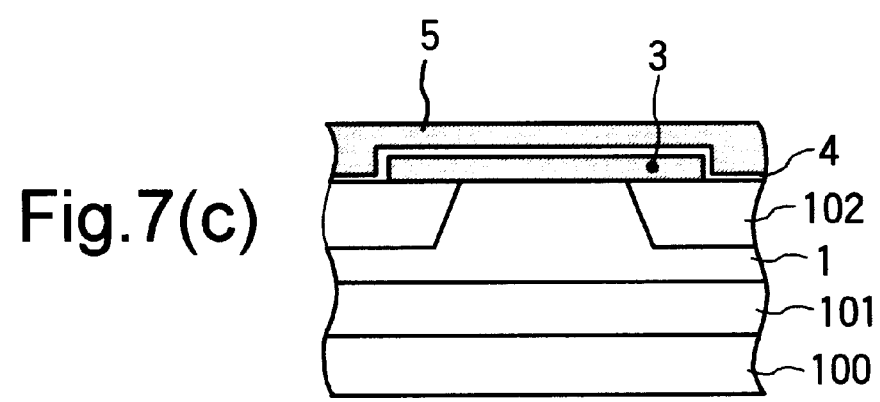
FIG. 7(c) is a cross section taken along the line B–B' of the conventional EEPROM.
Figure 8:
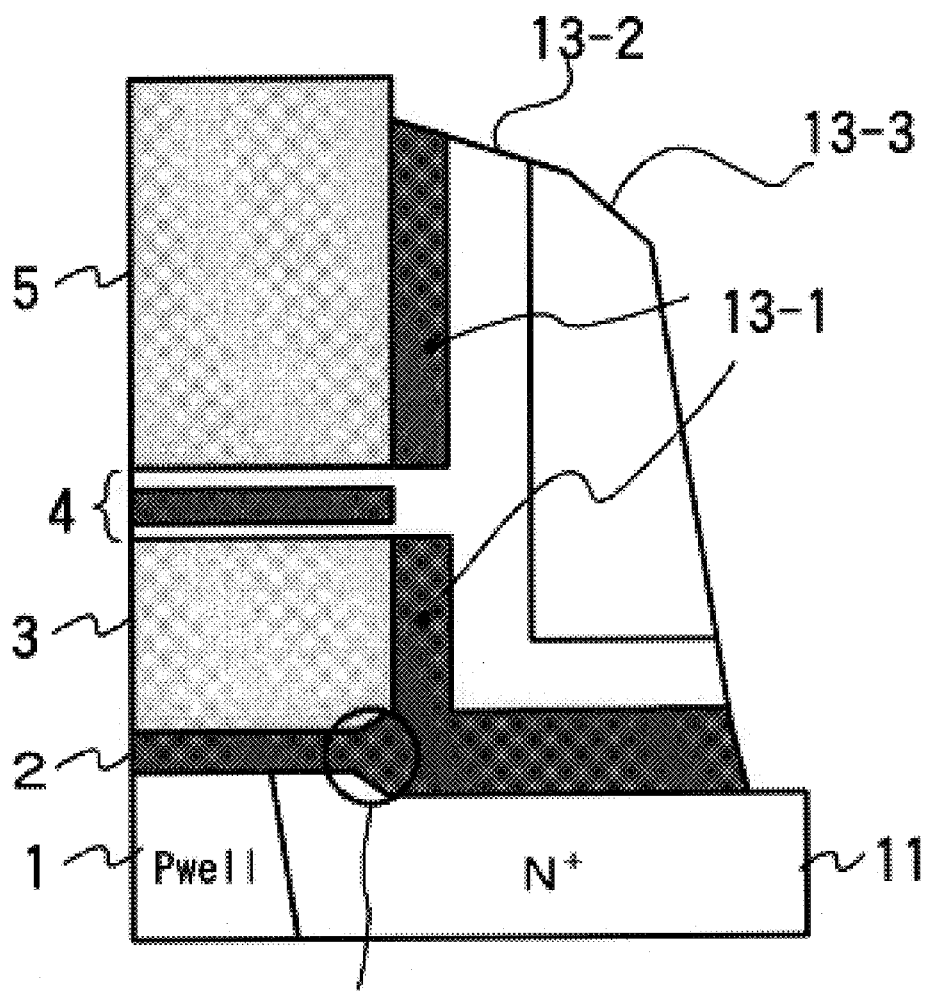
FIG. 8 is a cross section showing the structure of the conventional EEPROM.

FIG. 5 shows an EEPROM according to a third embodiment of the invention.

In the third embodiment as well, since the processes of selectively forming the gate electrode and selectively doping impurities are substantially the same as those of the first embodiment, their description is omitted here.

The nitride film 14, the HTO film 15 of 40 angstroms, the nitride film 16 of 80 angstroms, and the HTO film 17 of 40 angstroms are sequentially formed on the whole surface. Further, the CVD oxide film 10 of 1100 angstroms is formed on the HTO film 17. The CVD oxide film 10, HTO film 17, nitride film 16, HTO film 15, and nitride film 14 are anisotropically etched to thereby form a side wall. Even if heat treatment to improve the film quality of the HTO films 15 and 17 and to activate impurities is performed, in a manner similar to the second embodiment, the nitride film 14 works as a barrier layer and oxygen is not diffused into the tunnel oxide film, so that the gate bird's beak does not occur. Moreover, since the ONO film comprised of the HTO film 15—nitride film 16—HTO film 17 is formed on the side face of the gate electrode via the nitride film 14, the carrier holding characteristics of the floating gate 3 can be improved more than the second embodiment.

Although the description has been given on the assumption that the writing is made when electrons are moved into the drain in the first to third embodiments, the invention is not limited to the embodiments. The invention can be also applied to a case where writing is made by other methods within the scope of the technical idea of the invention.

By forming the ONO structured film on the side faces of the control and floating gates, occurrence of the gate bird's beak can be suppressed or eliminated, so that the reliability of the EEPROM can be remarkably improved.

What is claimed is:

1. A semiconductor storage device for holding data on the basis of carriers held in a floating gate, comprising:

a gate insulating layer formed on a floating gate;

a control gate formed on said gate insulating layer;

a first nitride film formed on side faces of the floating gate and the control gate;

a first oxide film formed on a side face of the first nitride film;

a second nitride film formed on a side face of the first oxide film; and a second oxide film formed on a side face of the second nitride film, wherein the first nitride film, the first oxide film, the second nitride film, and the second oxide film form a side wall of the floating gate and the control gate.

2. A semiconductor storage device according to claim 1, wherein each of the first and second oxide films is a hot thermal oxide (HTO) film.

3. A semiconductor storage device according to claim 1, wherein the second oxide film is composed of a hot thermal oxide (HTO) film and a CVD oxide film deposited by CVD.

4. A semiconductor storage device for holding data on the basis of carriers held in a floating gate, comprising:

a first insulating film formed between a floating gate and a semiconductor substrate;

a second insulating film formed between said floating gate and a control gate;

a first nitride film formed on sides of said floating gate, said second insulating film and said control gate, and said first nitride film formed on said first insulating film;

a first oxide film formed on a side of said first nitride film;

a second nitride film formed on a side of said first oxide film; and a second oxide film formed on a side of said second nitride film;

wherein said first oxide film, said second nitride film and said second oxide film are formed as a side wall of said floating gate and said control gate.

5. A semiconductor storage device according to claim 4, wherein said second insulating film is a stacked layer of a third oxide film, a third nitride film and a fourth oxide film, said third nitride film being thicker than said third and fourth oxide films.

6. A semiconductor storage device according to claim 4, wherein said first oxide film is thinner than said second nitride film, said second nitride film is thinner than said second oxide film.

7. A semiconductor storage device according to claim 4, further comprising a third oxide film formed between said second nitride film and said second oxide film.

\* \* \* \* \*